(12) United States Patent
Sakuma et al.

(10) Patent No.: US 8,927,851 B2
(45) Date of Patent: Jan. 6, 2015

(54) SOLAR CELL MODULE AND METHOD OF MANUFACTURING SOLAR CELL MODULE

(71) Applicant: Sanyo Electric Co., Ltd., Moriguchi, Osaka (JP)

(72) Inventors: Toshiyuki Sakuma, Izumisano (JP); Haruhisa Hashimoto, Minoh (JP); Satoshi Tohoda, Kobe (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 13/683,131

(22) Filed: Nov. 21, 2012

(65) Prior Publication Data

US 2013/0125951 A1    May 23, 2013

Related U.S. Application Data

(63) Continuation of application No. PCT/JP2011/062259, filed on May 27, 2011.

(30) Foreign Application Priority Data

May 31, 2010  (JP) ................................. 2010-125230

(51) Int. Cl.
  *H01L 31/05* (2014.01)
  *H01L 31/18* (2006.01)
(52) U.S. Cl.
  CPC ............ *H01L 31/05* (2013.01); *H01L 31/0512* (2013.01); *H01L 31/0504* (2013.01); *H01L 31/0508* (2013.01); *H01L 31/18* (2013.01); *Y02E 10/50* (2013.01)
  USPC ................................. 136/244; 438/64; 438/73
(58) Field of Classification Search
  CPC ........................ H01L 31/05–31/0512
  USPC .................................................. 136/243–265
  See application file for complete search history.

(56) References Cited

U.S. PATENT DOCUMENTS

| 4,301,322 | A | * | 11/1981 | Amick | .......................... | 136/256 |
| 6,586,270 | B2 | * | 7/2003 | Tsuzuki et al. | .................. | 438/57 |
| 2008/0121265 | A1 | * | 5/2008 | Hishida et al. | ................. | 136/244 |
| 2010/0108141 | A1 | * | 5/2010 | Fukushima et al. | .......... | 136/256 |
| 2010/0116314 | A1 | * | 5/2010 | Fukushima et al. | .......... | 136/244 |
| 2010/0126551 | A1 | | 5/2010 | Okamoto et al. | | |
| 2011/0017261 | A1 | | 1/2011 | Saita et al. | | |
| 2011/0120520 | A1 | | 5/2011 | Okada et al. | | |

FOREIGN PATENT DOCUMENTS

| JP | 2006-278710 | A | 10/2006 |
| JP | 2007-214533 | A | 8/2007 |
| WO | 2008/023795 | A1 | 2/2008 |
| WO | 2009/104627 | A1 | 8/2009 |
| WO | 2009/144898 | A1 | 12/2009 |

OTHER PUBLICATIONS

Machine translation of JP 2006-278710.*

* cited by examiner

*Primary Examiner* — James Lin
*Assistant Examiner* — Liesl C Baumann
(74) *Attorney, Agent, or Firm* — Marvin A. Motsenbocker; MOTS Law, PLLC (57) ABSTRACT

Disclosed is a solar cell module that includes: a plurality of solar cells connected with one another in such a manner that electrodes formed on surfaces of neighboring solar cells are connected with each other through a wiring member. A portion of the wiring member bites the electrodes, and the solar cells and the wiring member are bonded to each other by a resin.

7 Claims, 13 Drawing Sheets

SOLAR CELL MODULE AND METHOD OF MANUFACTURING SOLAR CELL MODULE

CROSS REFERENCE TO RELATED APPLICATIONS

This application is a continuation application of International Application No. PCT/JP2011/062259, filed on May 27, 2011, entitled "SOLAR CELL MODULE AND SOLAR CELL MODULE MANUFACTURING METHOD", which claims priority based on Article 8 of Patent Cooperation Treaty from prior Japanese Patent Applications No. 2010-125230, filed on May 31, 2010, the entire contents of which are incorporated herein by reference.

BACKGROUND OF THE INVENTION

1. Field of the Invention

The invention relates to a solar cell module and a method of manufacturing a solar cell module.

2. Description of Related Art

A solar cell module has a configuration in which a plurality of solar cells are connected in series or parallel by wiring members electrically connected with electrodes on front and back surfaces of the solar cells. In manufacturing solar cell modules, soldering is conventionally used to connect the electrodes and the wiring members of the solar cells with each other. The soldering is widely used because being excellent in conductivity and connection reliability such as fixing strength, and having inexpensive and versatile characteristics.

On the other hand, a wiring connection for a solar cell without using soldering has been also considered to decrease heat affect during the process of connecting a wiring member. For example, there is known a method of connecting a solar cell with a wiring member by using an adhesive film having a resin adhesive (see, for example, Patent Document 1).

In the wiring connection using the adhesive film, a wiring member is connected with an electrode of a solar cell by a resin adhesive in such a manner that the wiring member and the solar cell are heated while being pressed against each other with the adhesive film disposed between the wiring member and the electrode of the solar cell.

As one of the aforementioned solar cell modules using the resin adhesive, there has been proposed a solar cell module in which a bus bar electrode formed on the surface of the solar cell is buried in a wiring member in order to prevent the electrode and the wiring member from peeling off each other (for example, Patent Document 2). The wiring member is provided with a soft conductor layer, such as soldering, around a copper foil so that the bus bar electrode can be buried easily.

PRIOR ART DOCUMENT

Patent Document 1: Japanese Patent Application Publication No. 2007-214533
Patent Document 2: Domestic Re-publication of PCT International Application WO2008/023795

SUMMARY OF THE INVENTION

The solar cell module described in Patent Document 2 has sufficient electrode-peel strength, but is still required to enhance the reliability under thermal cycles.

The invention provides a solar cell module including a plurality of solar cells connected with one another by connecting electrodes formed on surfaces of neighboring solar cells by wiring members, wherein a portion of the wiring members bites the electrodes and the solar cells and the tabs are bonded with each other by a resin.

In addition, the invention includes the steps of: forming an electrode on a surface of a solar cell; disposing a wiring member on a resin disposed to cover the electrode, the wiring member being to be connected with an electrode formed on a surface of a neighboring solar cell; and heating the solar cell while applying pressure in a direction toward the solar cell from above the wiring member, and thereby causing a portion of the wiring member to bite the electrode. Here, the surface of the wiring member is harder than the surface of the electrode.

DETAILED DESCRIPTION OF EMBODIMENTS

Solar cell modules according to embodiments are described in detail by referring to the drawings. Note that same reference numerals are given to same or equivalent portions in the drawings, and the description thereof is not repeated for avoiding duplicated description.

Figure 1:
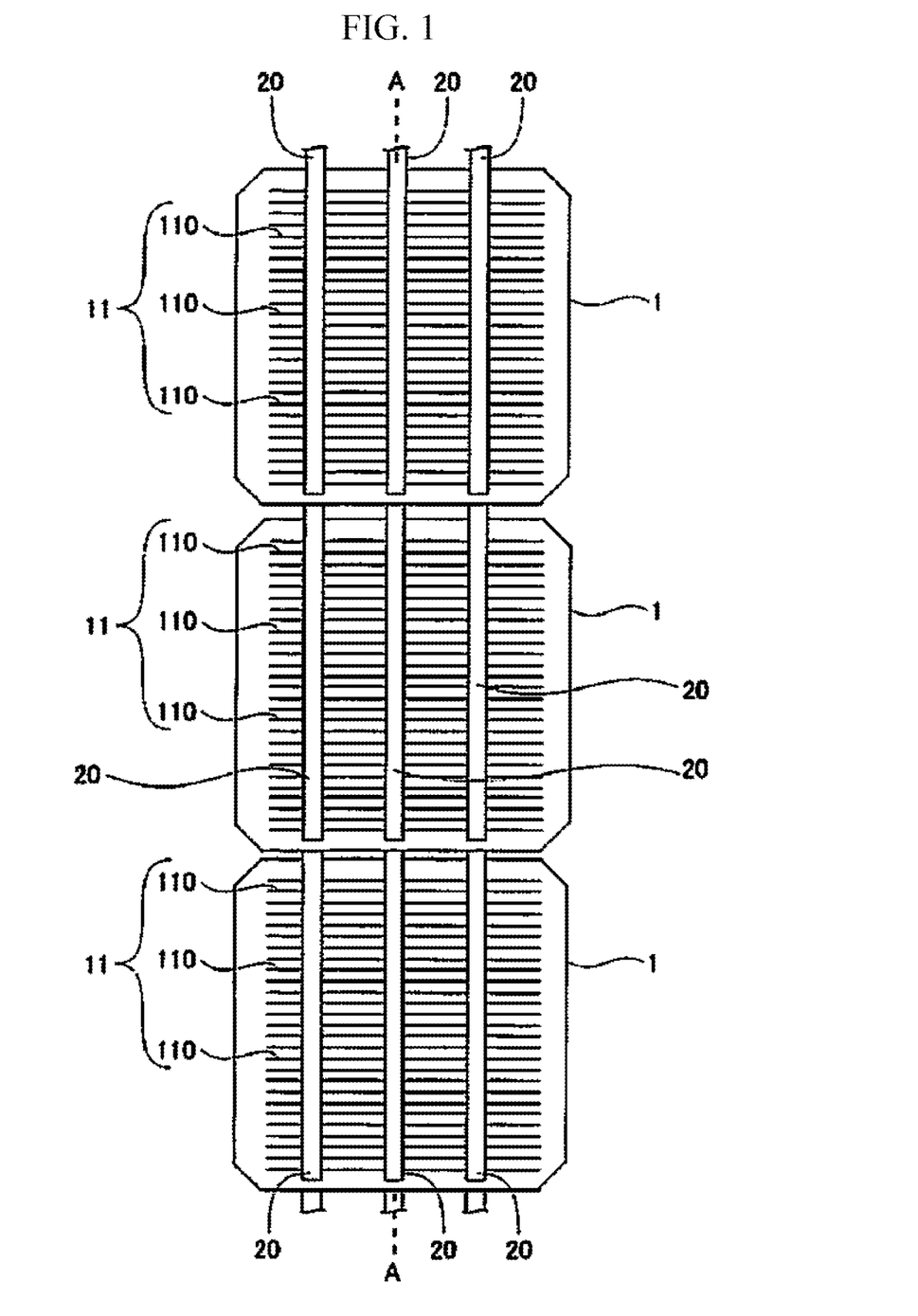
FIG. 1 is a plan view of solar cells in a solar cell module according to an embodiment

Prepositions, such as "on", "over" and "above" may be defined with respect to a surface, for example a layer surface, regardless of that surface's orientation in space. The preposition "above" may be used in the specification and claims even if a layer is in contact with another layer. The preposition "on" may be used in the specification and claims when a layer is not in contact with another layer, for example, when there is an intervening layer between them FIG. 1 is a solar cell module according to the embodiment. As shown in FIG. 1, the solar cell module includes a plurality of plate-like solar cells 1. The solar cell is made of a crystalline semiconductor including, for example, a single crystal silicon or polycrystalline silicon with a thickness of approximately 0.15 mm and has a substantially square shape with one side of 125 mm. However, the thickness, size and the like are not limited to those and a solar cell with another configuration may be used.

For example, in solar cell 1, an n-type region and a p-type region are formed to form a semiconductor junction for generating an electric field for carrier separation in an interface portion between the n-type region and the p-type region.

Figure 2:
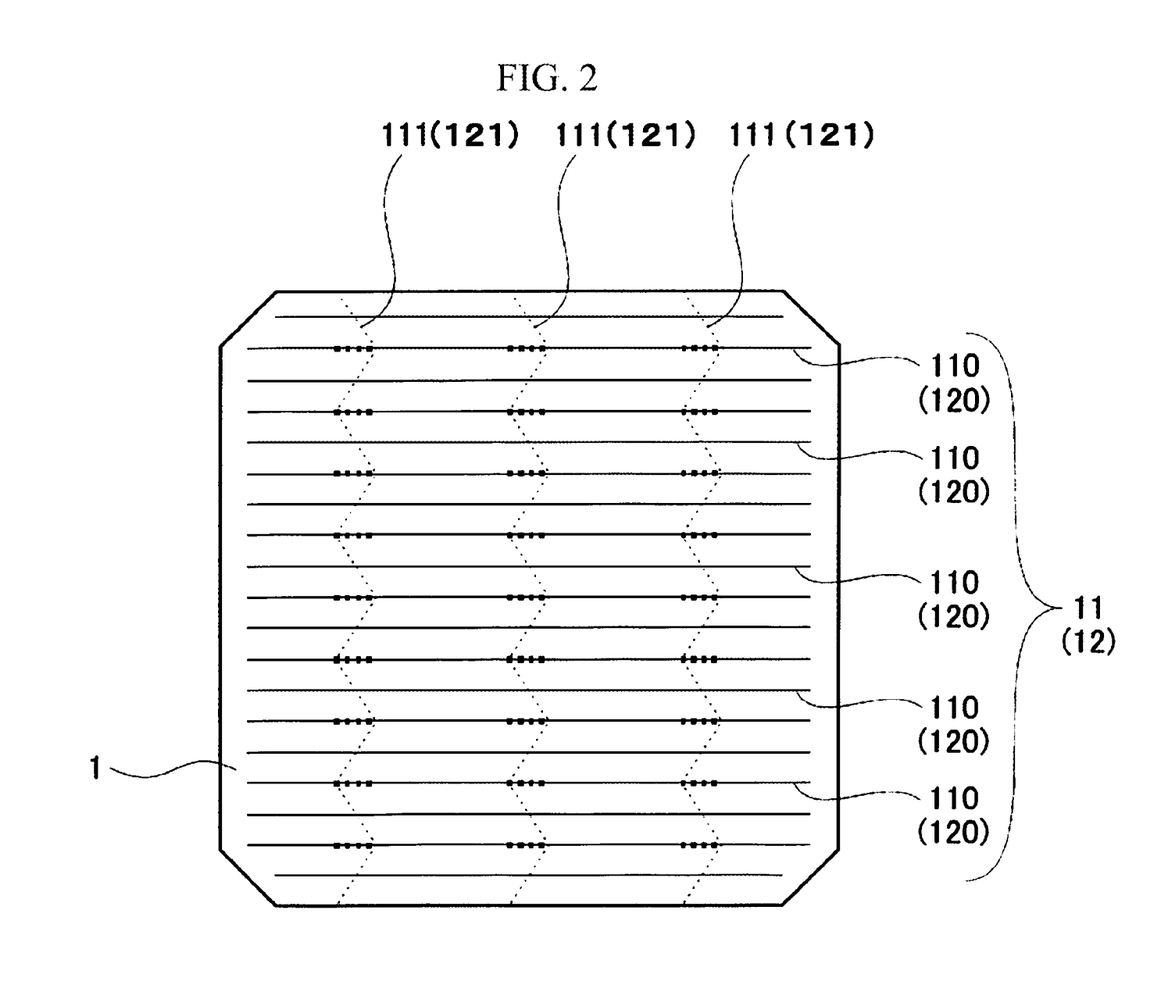
FIG. 2 is a schematic plan view showing a solar cell according to the embodiment.
Figure 3:
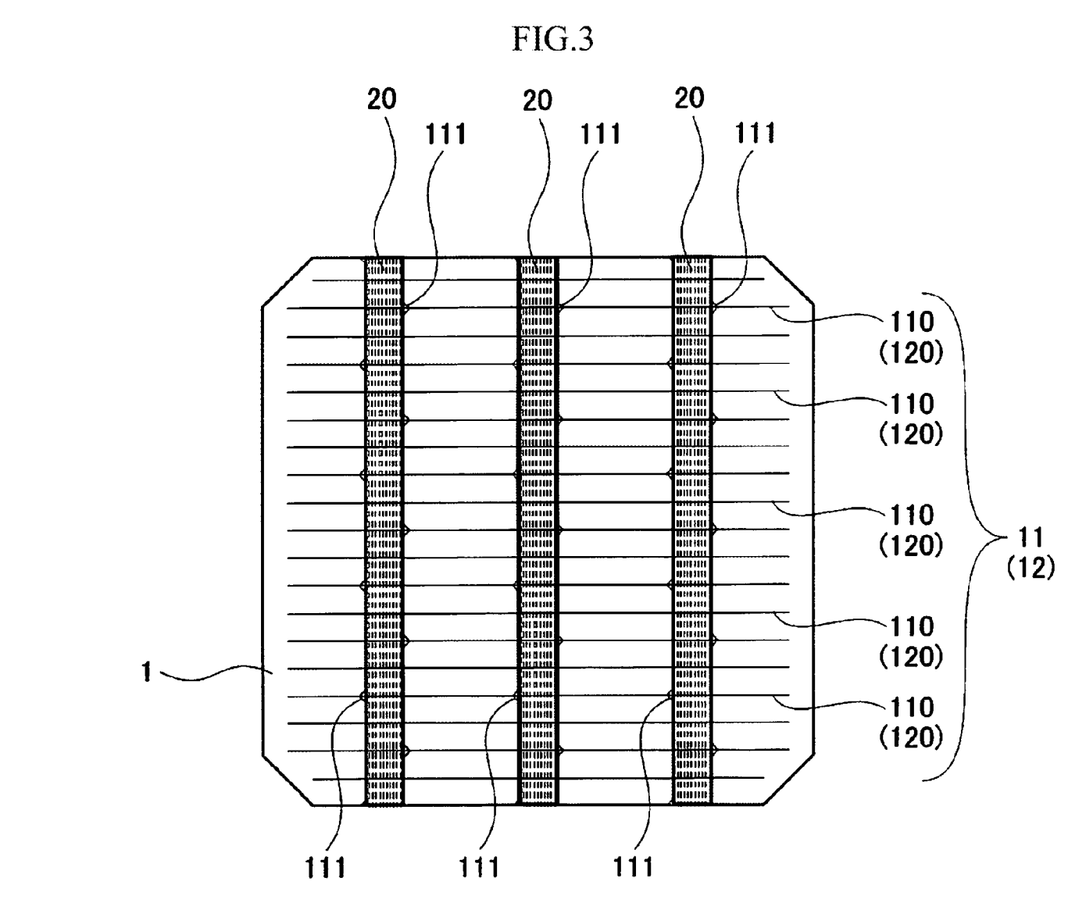
FIG. 3 is a schematic plan view showing that tabs are bonded to a solar cell in the embodiment.

As shown in FIG. 2, front electrode 11 is formed on a surface on a light-receiving side (front side) of solar cell 1, and back electrode 12 is formed on a surface of the back side. In the embodiment, front electrode 11 includes a plurality of finger electrodes 110 formed in parallel to one another. For example, approximately 55 finger electrodes 110 are formed with a finger electrode width of approximately 100 μm and a pitch of approximately 2 mm. As shown in FIG. 3, tabs 20 as wiring members are connected with finger electrodes 110 at right angles. Bus bar electrodes 111 are provided on front electrode 11 at positions where tabs 20 are to be connected. Bus bar electrodes 111 are electrically connected with all finger electrodes 110. Bus bar electrodes 111 are each formed in the form of a zigzag line in order to have preferable properties of bonding with tabs 20 and provide preferable electric connection between finger electrodes 110 and tabs 20.

Also, back electrode 12 is formed on a surface portion on a back side of solar cell 1. Back electrode 12 includes a plurality of finger electrodes 120 formed in parallel to one another. For example, approximately 217 finger electrodes 120 are formed with a finger electrode width of approximately 100 μm and a pitch of approximately 0.5 mm. Bus bar electrodes 121 are provided on back electrode 12 at positions where tabs 20 are to be connected. Bus bar electrodes 121 are electrically connected with all finger electrodes 120. Bus bar electrodes 112 are each formed in the form of a zigzag line in order to have preferable properties of bonding with tabs 20 and provide preferable electric connection between finger electrodes 120 and tabs 20.

Such front electrode 11 and back electrode 12 can be formed by screen painting of a thermosetting or heat burning silver paste, for example. Instead of this, they may be formed using other methods such as a deposition, sputtering, and plating method.

In FIG. 2, dots depicted in a region where bus bar electrodes 111 (121) and finger electrodes 110 (120) are connected with tabs 20 schematically show spots where vertex portions of tabs 20 bite the electrodes, which is described later. Also, dots depicted in tabs 20 in FIG. 3 schematically show spots where vertex portions bite the electrodes. Tabs 20 have such a small width that angled portions of bus bar electrodes 111 can be exposed from tabs 20. Accordingly, tabs 20 and bus bar electrodes 111 are easily aligned with each other.

As shown in FIG. 1, three tabs 20 are connected on top of front electrode 11 and back electrode 12. A width of tab 20 is approximately 1.5 mm.

Note that, in order to increase an amount of light entering the light-receiving surface of solar cell 1, the number of finger electrodes 110 of front electrode 11 is set smaller than the number of finger electrodes 120 of back electrode 12. Also, a thickness of finger electrode 110 of front electrode 11 is set larger than a thickness of finger electrode 120 of back electrode 12, so that resistance in front electrode 11 can be decreased. Thus, solar cell characteristics can be further enhanced.

Figure 4:
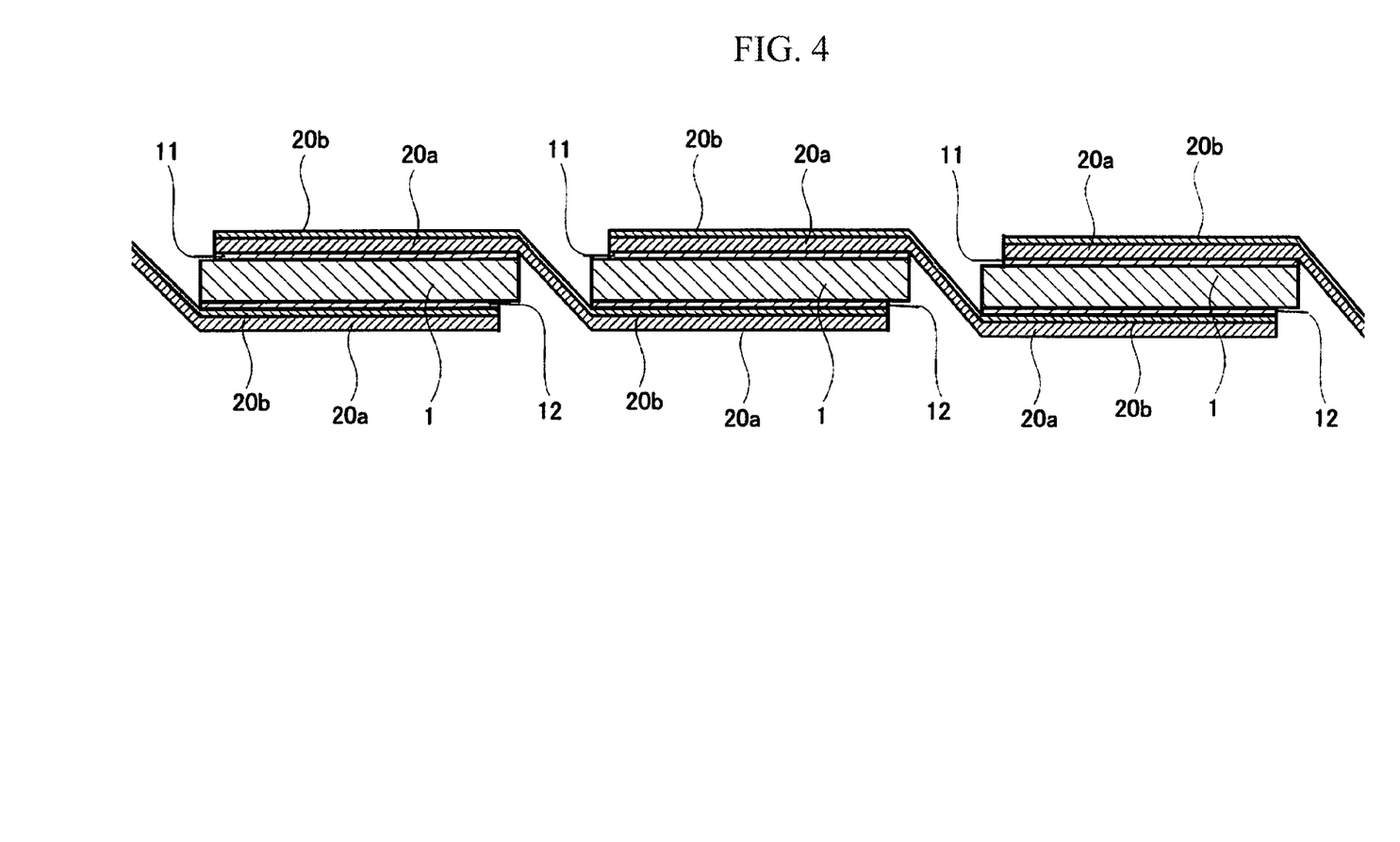
FIG. 4 is a cross-sectional view taken along the A-A' line in FIG. 1.

Hereinafter, a method of manufacturing a solar cell module using solar cells 1 is described. FIG. 4 is a cross-sectional view taken along the A-A' line in FIG. 1. In the solar cell module, tabs 20 as wiring members are electrically connected with front electrode 11 and back electrode 12 as shown in FIG. 1 and FIG. 4. Resin member 3 is used for connecting tabs 20 with front electrode 11 and back electrode 12. For example, an anisotropic conductive resin member may be used as resin member 3.

An anisotropic conductive resin member includes at least a resin adhesive component and conductive particles dispersed therein. The resin adhesive component includes a composition containing a thermosetting resin. Resins usable as the resin adhesive component are, for example, epoxy resins, phenoxy resins, acryl resins, polyimide resins, polyamide resins, polycarbonate resins, urethane resins, and the like. Among these thermosetting resins, one kind or a combination of two or more kinds of resins are used, and a preferable thermosetting resin is made of one or more kinds of resins selected from the group consisting of epoxy resins, phenoxy resins, and acryl resins.

As the conductive particles, used are, for example, metal particles such as gold particles, silver particles, copper particles and nickel particles, or conductive particles, such as gold plating particles, copper plating particles or nickel plating particles in which the surfaces of conductive or insulating core particles are coated with a conductive layer such as a metal layer.

Firstly, resin member 3 is disposed between front and back electrodes 11, 12 and tab 20. Resin member 3 may have the same or smaller width than a width of tab 20 to be connected. For example, if the width of tab 20 is 0.5 mm to 3 mm, the width of resin member 3 is set to 0.5 mm to 3 mm, or slightly smaller, corresponding to the width of tab 20. In the embodiment, three tabs 20 each having a width of 1.2 mm are used as shown in FIG. 1. Accordingly, three resin members 3 each having a width corresponding to the width of tab 20 are disposed on positions where tabs 20 are to be bonded. Note that resin member 3 may have a larger width than the width of tab 20 if resin member 3 has translucency even after being cured by heat.

Figure 6:
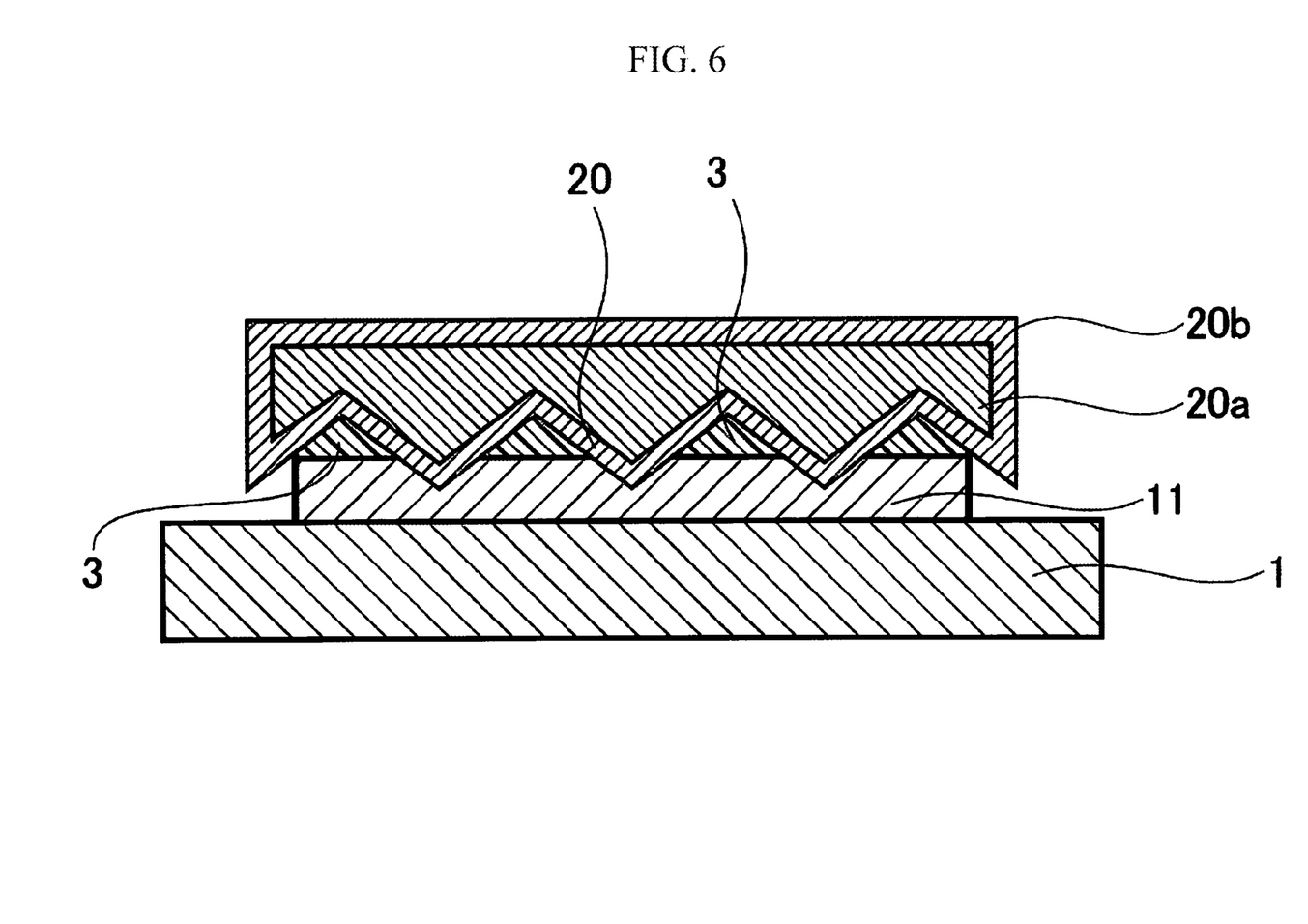
FIG. 6 is a schematic cross-sectional view showing that a tab is bonded to a solar cell in the embodiment.

As shown in FIG. 6, tab 20 includes copper thin plate 20a as a core and silver layer 20b provided on the surface of tab 20. Silver layer 20b forms a layer harder than front electrode 11 and back electrode 12.

Figure 10:
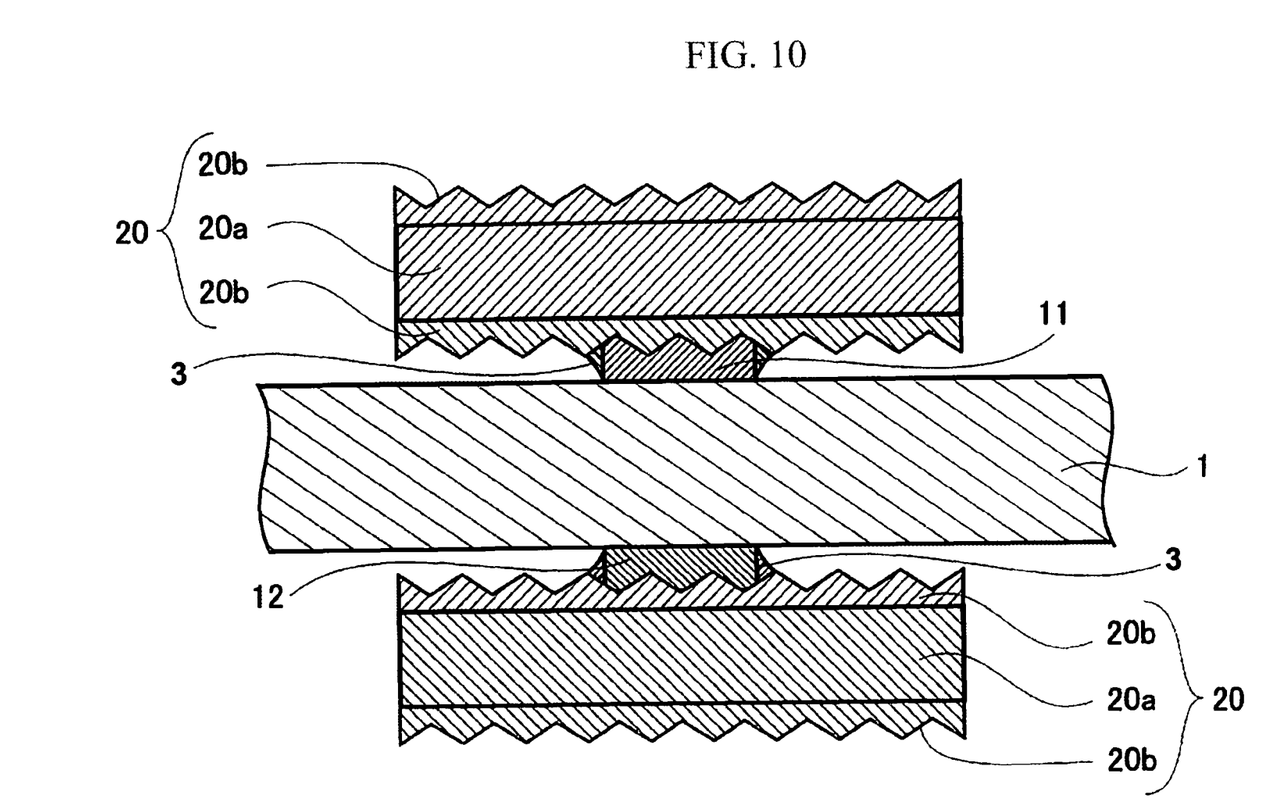
FIG. 10 is a schematic cross-sectional view showing that tabs are bonded to a solar cell in the embodiment.

Tab 20 is provided with fine corrugations on at least one side thereof and has a height of approximately 10 to 50 um in vertex portions of the corrugations. Tab 20 shown in FIG. 6 is provided with fine corrugations on one side and a flat surface on the other side. This type of tab is called a single-side-corrugated tab. Tab 20 shown in FIG. 10 is provided with fine corrugations on both sides. This type of tab is called a double-side-corrugated tab. The corrugations of the tab can be formed by using grooves extending in a longitudinal direction of tab 20, many pyramid-shaped projections formed on the surface, or the like.

Tab 20 in which silver layer 20b is provided on the surface having the fine corrugations is pressed against resin member 3, and is heated while being pressed to cure resin member 3 by heat, so that tab 20 is connected with front electrode 11 and back electrode 12.

To electrically connect a plurality of neighboring solar cells 1 with each other by tabs 20, tab 20 is placed on each of resin members 3 provided on both sides of solar cell 1 in such a manner that one end side of tab 20 is connected with front electrode 11 on the light-receiving surface side of certain solar cell 1 and the other end side is connected with back electrode 12 on the back side of another solar cell neighboring certain solar cell 1.

Figure 13A:
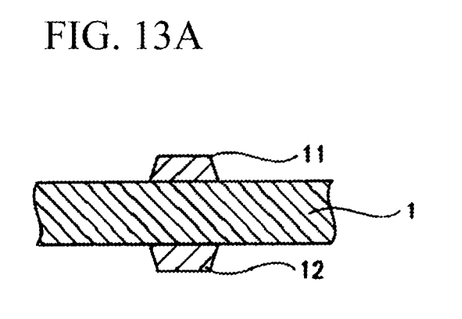
FIGS. 13A, 13B, 13C, and 13D are schematic views showing how to bond tabs according to the embodiment.
Figure 13B:
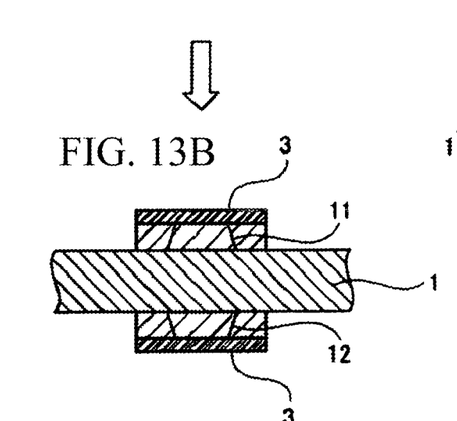
Figure 13C:
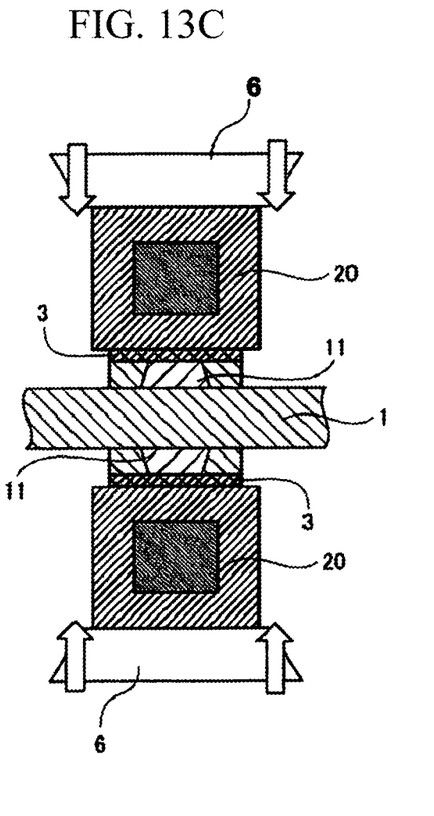
Figure 13D:
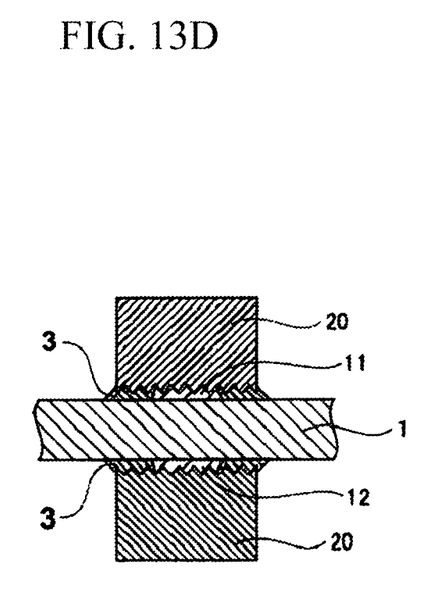

As shown in FIGS. 13A to 13D, solar cell 1 is prepared (FIG. 13A) and resin members 3 are placed on front electrode 11 and back electrode 12 of solar cell 1 (FIG. 13B). Then, solar cell 1 placed on heat block 6, for example, is pressed using another heat block 6 with a pressure of approximately 0.05 to 1.00 MPa, for example, and thereby tab 20 is pressed toward solar cell 1 with resin members 3 interposed in between (FIG. 13C). Then, high-temperature heating is performed with a temperature of heat block 6 set high for thermosetting of a resin adhesive component of resin member 3, for example, a temperature between 120° C. and 200° C., both inclusive. Thus, fix tabs 20 are fixed by compression bonding, so that solar cells 1 are electrically connected and arranged (FIG. 13D).

Solar cell 1 is heated under pressure in a direction toward solar cell 1 from above tabs 20 disposed on resin member 3. In this heating process, the surface region of silver layer 20b of tab 20 remains harder than front electrode 11 and back electrode 12.

Figure 7:
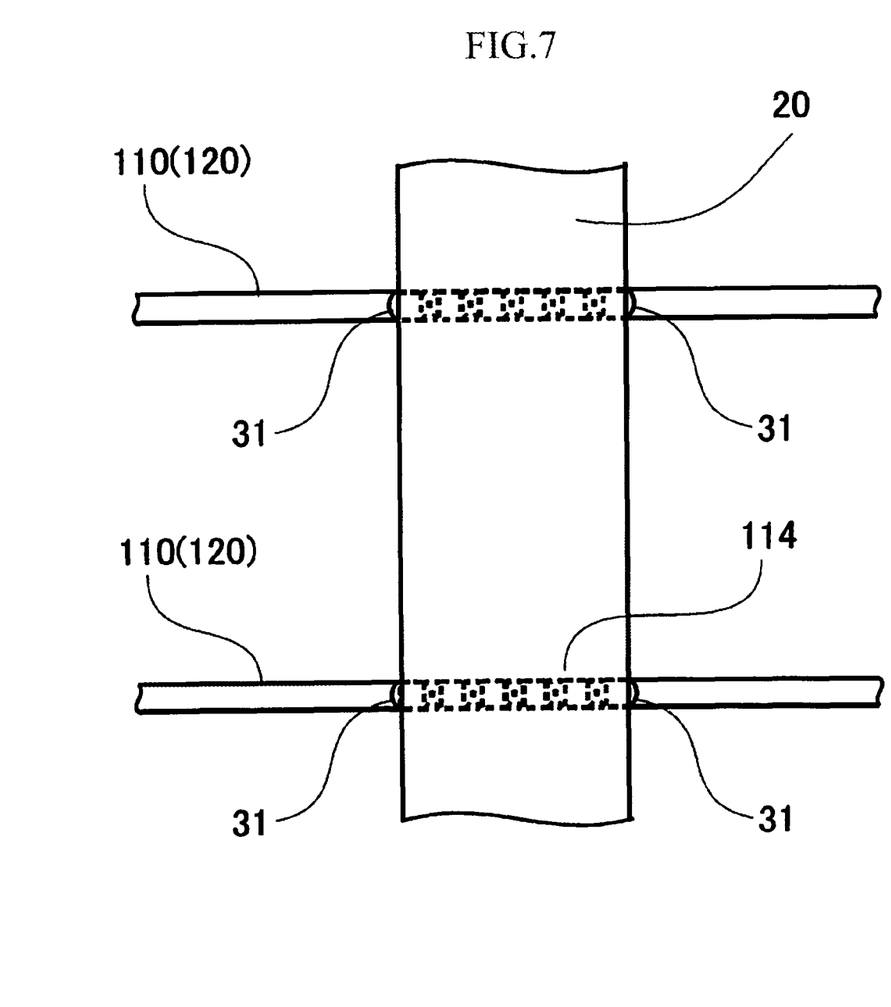
FIG. 7 is a schematic plan view showing that a tab is bonded to a solar cell in the embodiment.

Thus, as shown in FIGS. 6, 7, and 13D, the vertex portions (projection portions) of tab 20 bite front electrode 11 and back electrode 12, and tab 20 is bonded to front electrode 11 and back electrode 12 by resin member 3. In this way, silver layer 20b having the vertex portions causes the electrodes (bus bar electrodes 111, 121) formed of a solidified epoxy resin mainly containing silver particles to bite both of front electrode 11 and back electrode 12.

Similarly, second solar cell 1 is placed on tabs 20 and is fixed with light pressure. Then, the bonding is performed in the same procedures as the above. A desired number of solar cells 1 are joined to one another to form a string, and consequently a solar cell module is formed.

The warpage of solar cell 1 is considered to occur due to a difference in linear expansion coefficient between tab 20 and solar cell 1. Since such warpage is proportional to temperature, a higher temperature applied to tab 20 and solar cell 1 is likely to cause larger warpage of solar cell 1. Accordingly, it can be said that the most effective way to reduce the warpage of solar cell 1 is adhesive bonding at a low temperature.

Since the solar cell module according to the embodiment uses resin member 3 capable of bonding at a lower temperature than an alloy bonding by soldering, stress due to the warpage on front and back surfaces of solar cell 1 can be made smaller and occurrence of the warpage can be prevented.

Furthermore, since resin member 3 adhere to the surroundings of silver layer 20b of tab 20 biting front electrode 11 and back electrode 12, the bonding strength of tab 20 can be increased.

Note that an anisotropic conductive resin member is shown as an example of resin member 3 in the above-described embodiment, but one not containing conductive particles can be used as resin member 3. When a resin member not containing conductive particles is used as resin member 3, part of the surfaces of front electrode 11 and back electrode 12 is brought into direct contact with the surface of tabs 20, and thereby front and second electrodes 11 and 12 and tabs 20 are electrically connected with each other. Even in this case, silver layer 20b of tab 20 bites front electrode 11 and back electrode 12, and thus sufficient electric connection can be obtained.

In this manner, the plurality of solar cells 1 connected with each other by tabs 20 are sandwiched between translucent sealing material sheets such as EVA, and then placed between a front member made of glass and a back member made of a weather resistant film or a glass or plastic material. Then, solar cells 1 are sealed by the sealing material between the front member and the back member by a laminator. Consequently, a solar cell module is obtained.

Figure 11:
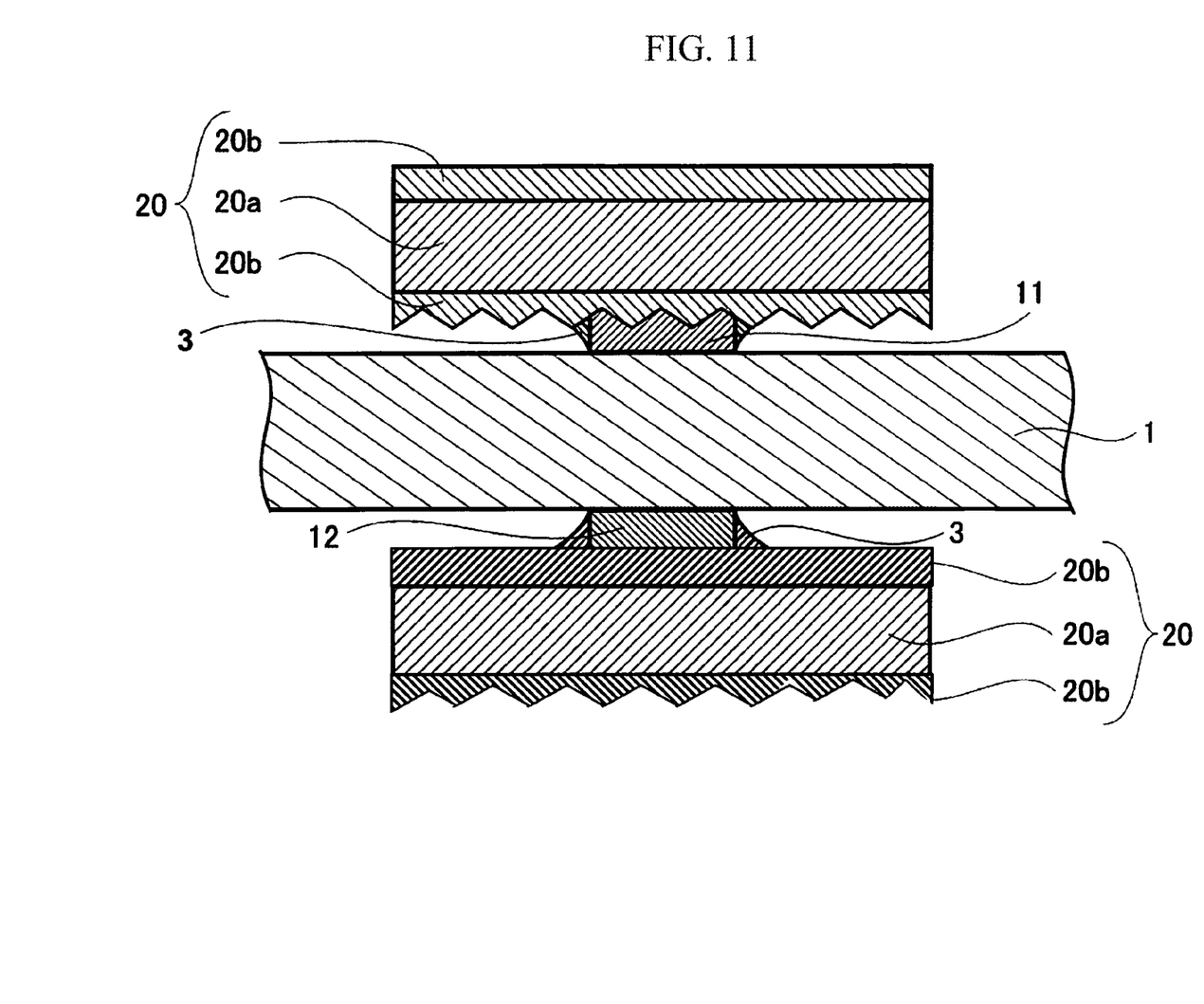
FIG. 11 is a schematic cross-sectional view showing that tabs are bonded to a solar cell in the embodiment.

FIG. 11 shows that front and back surfaces of neighboring solar cells are connected using a single-side-corrugated tab. In this example, the vertex portions face the front side of solar cell 1 and the flat portion faces the back side. Accordingly, the vertex portions of tab 20 on the front side bite electrode 11. However, the tab 20 does not bite back electrode 12 on the back side of solar cell 1.

Figure 5:
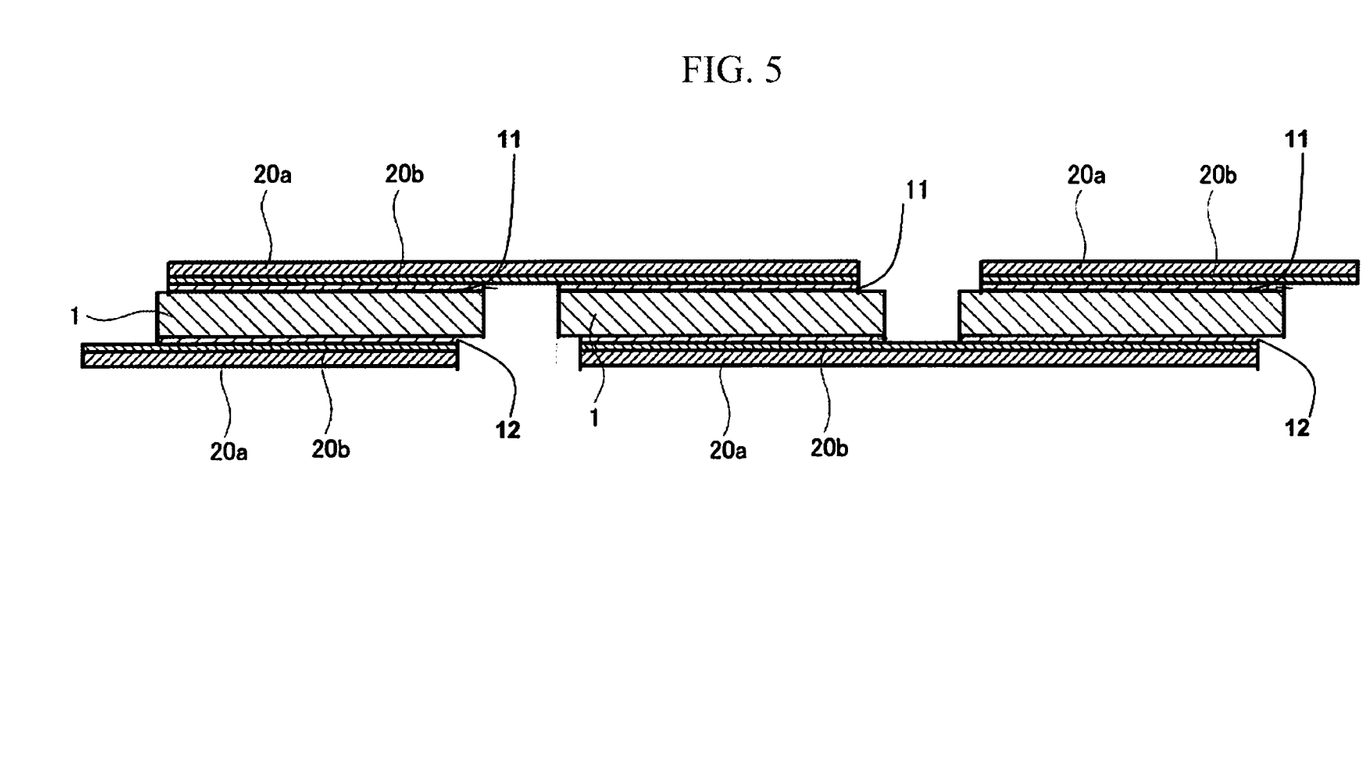
FIG. 5 is a schematic cross-sectional view in the embodiment.

FIG. 5 shows that the front surfaces of two neighboring solar cells 1 are connected with each other and the back surfaces thereof are also connected with each other by tabs 20. In this example, even when the single-side-corrugated tab is used, the vertex portions of tab 20 can be cause to bite both of front electrode 11 and back electrode 12. In this example, two neighboring solar cells 1 are connected in parallel and pairs of solar cells 1 arranged in parallel are connected in series.

Figure 8:
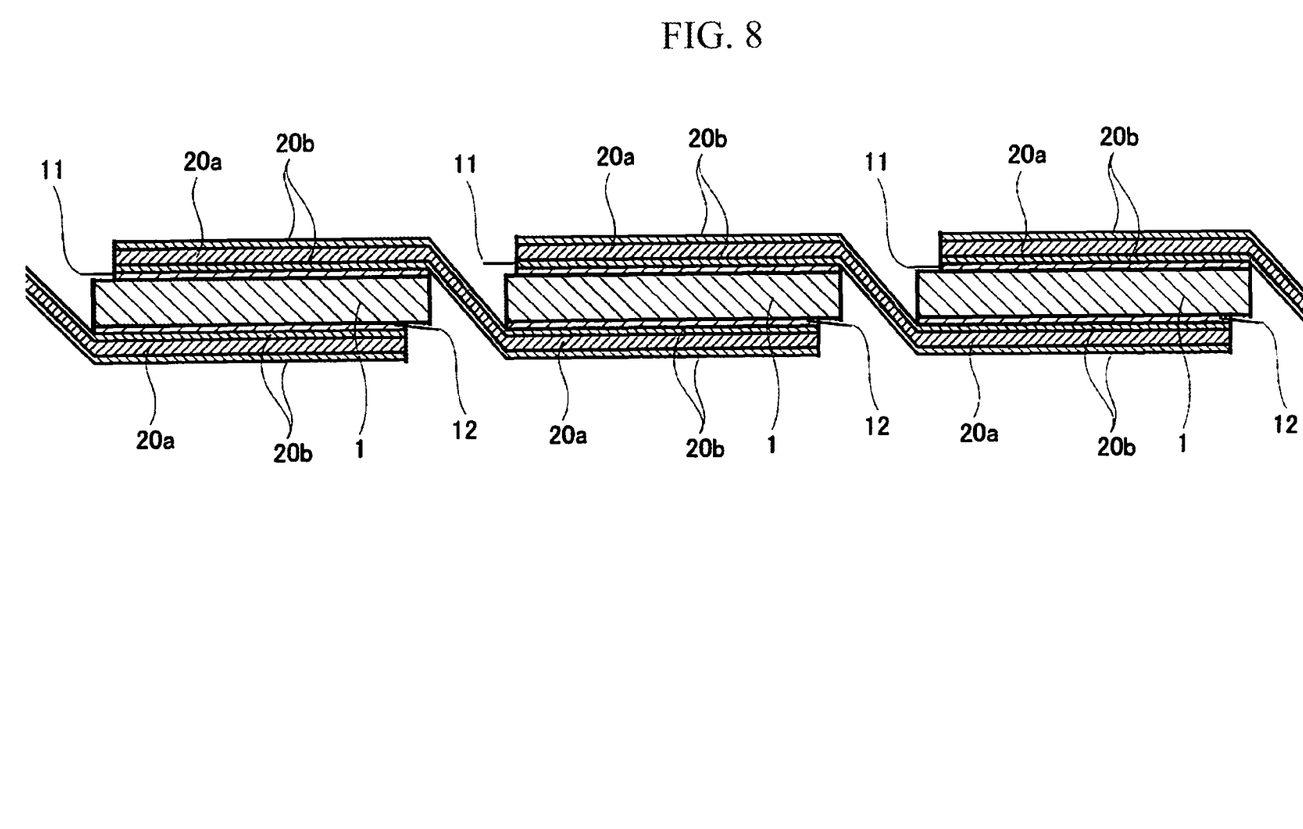
FIG. 8 is a schematic cross-sectional view in the embodiment.

FIG. 8 shows that front and back surfaces of neighboring solar cells are connected using double-side-corrugated tabs. In this example, the vertex portions of tabs 20 face both of front electrode 11 and back electrode 12 of solar cell 1. Accordingly, as shown in FIG. 10, the vertex portions of tabs 20 on the front and back sides bite both of front electrode 11 and back electrode 12.

Figure 9:
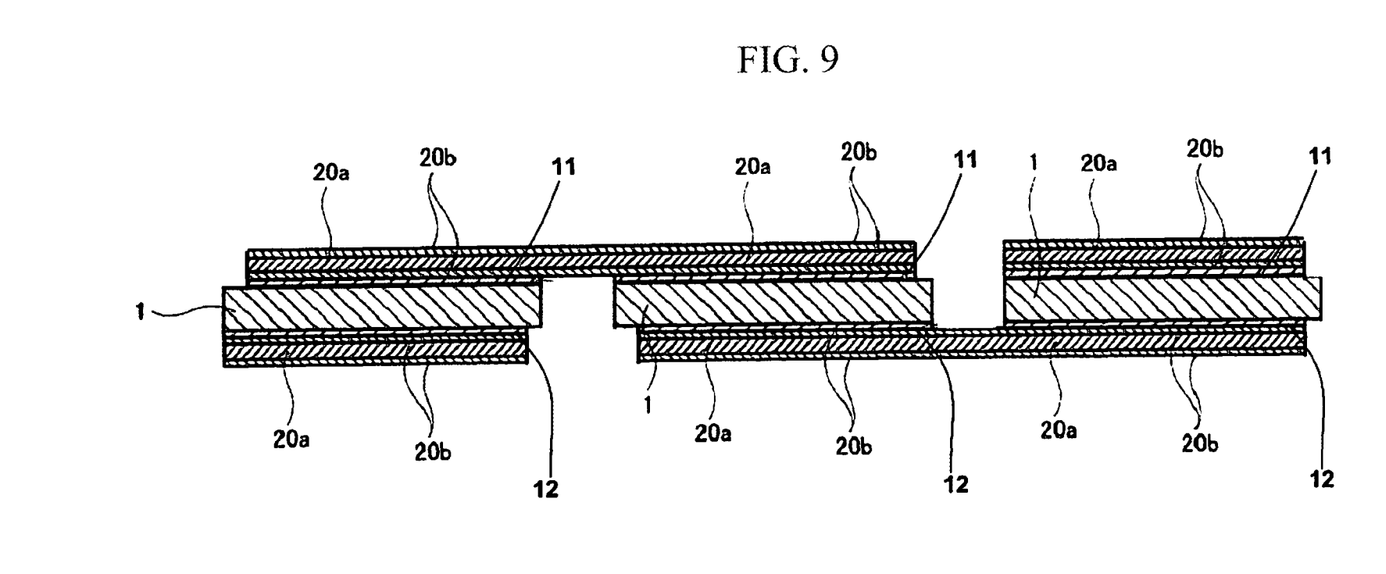
FIG. 9 is a schematic cross-sectional view in the embodiment.

FIG. 9 shows that the front surfaces of two neighboring solar cells 1 are connected with each other and the back surfaces thereof are also connected with each other by double-side-corrugated tabs. In this example, two neighboring solar cells 1 are connected in parallel and pairs of solar cells 1 arranged in parallel are connected in series.

Figure 12:
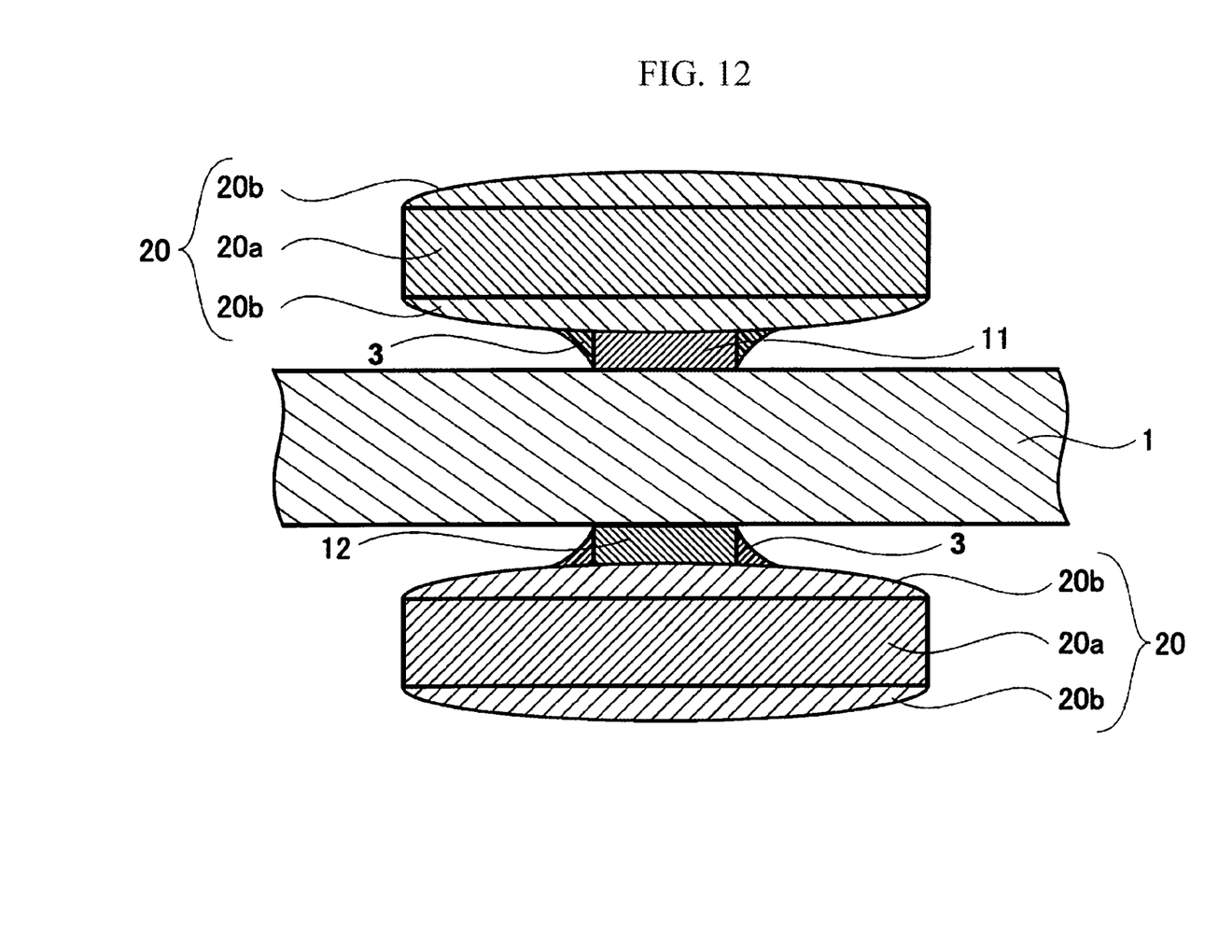
FIG. 12 is a schematic cross-sectional view showing that tabs are bonded to a conventional solar cell.

Next, a solar cell module of the embodiment and a solar cell module of a reference example are prepared and a temperature cycling test is performed. The temperature cycling test is performed under the conditions in which a temperature is raised from ordinary temperature to 90±2° C., then lowered to −40° C.±3° C., and returned to the ordinary temperature, each of upper limit temperature and lower limit temperature is maintained for 10 minutes or longer, one cycle is 6 hours or shorter, a temperature change rate is set at 87° C./hour both in temperature increasing and decreasing processes. This temperature cycling is repeated at 400 cycles. As shown in FIG. 12, the reference example uses as tab 20 one provided with tin coating layer 20b as a soft conductive body on the surface of copper foil 20a, and is connected with front electrode 11 and back electrode 12 by using the aforementioned anisotropic conductive adhesive. Note that tab 20 coated with tin is not provided with corrugations. As shown in FIG. 11, in example 1 of the embodiment, a single-side-corrugated tab provided with silver layer 20b is used on the front side and tin coating layer 20b as a soft conductive body covering the surface of copper foil 20a is provided on the back side.

In the solar cell module used in this test, both sides of one solar cell 1 are connected with relevant tabs 20, and then solar cell 1 is sandwiched between translucent sealing material sheets such as EVA and placed between a front member made of glass and a back member made of a weather resistant film. Then, the solar cell is sealed by the sealing material between the front member and the back member by the laminator.

Table 1 shows results of performing the test of 400 thermal cycles.

TABLE 1

|  | Front tab | Back tab | Decreasing rate after 400 thermal cycles |
|---|---|---|---|
| Reference example | Conventional (soldering) tab | Conventional (soldering) tab | 1 |
| Example 1 | Silver tab corrugated surface bonding | Soldering tab | 0.44 |

Table 1 shows a decreasing rate based on output values in a conventional example and example 1. Note that the decreasing rate is normalized by using the reference example as 1. From Table 1, it can be seen that the decreasing rate even after 400 thermal cycles is greatly decreased to 0.44, owing to the configuration in which silver layer 20b of tab 20 bites front electrode 11.

Next, example 1 and example 2 of the embodiment are prepared and examined by the test of 600 thermal cycles. Example 2 uses double-side-corrugated tabs 20 and silver layer 20b bites both of front electrode 11 and back electrode 12 as shown in FIG. 10. Table 2 shows the results.

TABLE 2

|  | Front tab | Back tab | Decreasing rate after 600 thermal cycles |
|---|---|---|---|
| Example 1 | Silver tab corrugated surface bonding | Soldering tab | 1 |
| Example 2 | Silver tab corrugated surface bonding | Silver tab corrugated surface bonding | 0.74 |

A decreasing rate is shown based on output values in the examples. Note that the decreasing rate is normalized by using example 1 as 1. From Table 2, it can be seen that use of a double-side-corrugated tab 20 is more effective because the decrease rate even after 600 thermal cycles is 0.74 with respect to the one using single-side tab 20.

In the embodiment, the tab bites the front electrode and back electrode as described above. This configuration is considered to generate anchor effects to suppress the movement of the tab in thermal expansion or thermal contraction of the tab, and thereby to enhance the reliability against temperature change.

Solar cells usable as solar cell 1 in the embodiment include, for example, a solar cell having a so-called HIT (registered trademark) structure in which a non-crystalline silicon layer is stacked on a surface of a crystalline silicon substrate, or a normal crystalline or thin-film solar cell.

In addition, bus bar electrodes 111, 121 in the above-described embodiment are each formed in the form of a zigzag line, but the invention can be applied to even a case where bus bar electrodes are in the form of a straight line.

Also, in the above-described embodiment, the electrode includes finger electrodes and bus bar electrodes. However, the invention can be applied even in a solar cell only having finger electrodes as an electrode.

Moreover, although the material for the tab is a copper foil in the description of the embodiment, any material having low electric resistance can be used for the tab. Besides copper, iron, nickel, silver or a combination thereof can provide similar effects.

Furthermore, in the tab in the embodiment, the core and the surface are formed of different materials. However, the invention can be applied to a tab in which the core and the surface are formed of a same material.

As explained above, the embodiments can provide a solar cell module with high reliability in which a portion of a wiring member bites an electrode to maintain tab strength even in thermal cycles. In this way, the embodiments of solar cell module and solar cell module manufacturing method enhance a solar cell output by preventing a wiring member from peeling off in thermal cycles.

It should be understood that all the aspects of the embodiments disclosed herein are only for illustrative purposes and are not intended to impose limitation. The scope of the invention is defined not by the description of the above embodiments but by the scope of claims, and the invention is intended to include equivalents to any in the scope of claims and all modifications within the scope of claims.

The invention claimed is:

1. A solar cell module comprising:
   a plurality of solar cells having finger electrodes on their surfaces and bus bar electrodes electrically connected to the finger electrodes, wherein
   neighboring solar cells are connected with each other through a wiring member having a corrugated portion on at least one side, and wherein
   the surface of the corrugated portion is harder than the surface of the finger electrodes, where the corrugated portion bites into the finger electrodes, and
   the solar cells and the wiring member are bonded to each other by a resin.

2. The solar cell module of claim 1, wherein
   the wiring member comprises a copper thin plate core with a silver surface that is harder than the finger electrodes.

3. The solar cell module of claim 2, wherein the corrugated portion comprises corrugations on at least one side of the wiring member with a height of approximately 10 to 50 microns in vertex portions of the corrugations.

4. The solar cell module of claim 3, wherein the corrugated portion comprises corrugations on both sides of the wiring member with a first side of the wiring member connecting to the finger electrodes on one side of a solar cell of the plurality of solar cells, and the second side of the wiring member connecting to the finger electrodes on one side of an adjacent solar cell of the plurality of solar cells.

5. The solar cell module of claim 1, wherein the bus bar electrodes are in the form of a zigzag line.

6. The solar cell module of claim 1, wherein the electrodes are made from thermoset or heat burning silver paste that is softer than the surface of the corrugated portion.

7. The solar cell module of claim 1, wherein the finger electrodes are front and back finger electrodes, and wherein the bus bar electrodes bite into the front and back finger electrodes.

* * * * *